(12) United States Patent
Jung et al.

(10) Patent No.: US 9,329,447 B2
(45) Date of Patent: May 3, 2016

(54) DISPLAY PANEL AND METHOD OF MANUFACTURING THE SAME

(71) Applicant: SAMSUNG DISPLAY CO., LTD., Yongin, Gyeonggi-Do (KR)

(72) Inventors: Jin-Soo Jung, Hwaseong-Si (KR); Young Gu Kim, Hwaseong-Si (KR); Byoung-Hun Sung, Hwaseong-Si (KR); Baekkyun Jeon, Yongin-Si (KR)

(73) Assignee: SAMSUNG DISPLAY CO., LTD., Yongin-Si, Gyeonggi-Do (KR)

( * ) Notice: Subject to any disclaimer, the term of this patent is extended or adjusted under 35 U.S.C. 154(b) by 428 days.

(21) Appl. No.: 13/830,766

(22) Filed: Mar. 14, 2013

(65) Prior Publication Data

US 2013/0342779 A1    Dec. 26, 2013

(30) Foreign Application Priority Data

Jun. 20, 2012 (KR) ........................ 10-2012-0066249

(51) Int. Cl.
*G02F 1/1345* (2006.01)
*G02F 1/1362* (2006.01)
(Continued)

(52) U.S. Cl.
CPC ........ *G02F 1/136286* (2013.01); *G02B 6/0083* (2013.01); *G02F 1/13452* (2013.01); *H01L 33/08* (2013.01); *H01L 2924/0002* (2013.01)

(58) Field of Classification Search
CPC .......... G02F 1/13452; G02F 1/133345; G02F 1/136286; G02F 1/13458; G02F 1/1368; G02F 1/1345; G02F 1/1362; G02F 1/13454; G02F 1/13306; G02F 1/134336; G02F 1/1333; G02F 1/13; G02F 2001/13456; G02F 2201/50; H01L 27/124; H01L 27/3276; H01L 27/3248; G09G 2300/0426; G09G 2320/0209; H05K 1/189; H05K 1/02; H05K 1/11; H05K 1/111; H05K 1/117; H05K 1/118; H05K 1/147; H05K 2201/10128; H05K 2201/09227; H05K 2201/10136; H05K 3/361; H05K 3/4007; H05K 13/00; H05K 5/0017; H05K 7/02
USPC ............ 257/72, 59; 349/43, 138, 65, 42, 139, 349/143, 149–152; 438/666, 669; 361/749, 361/679.01, 760, 784; 174/250, 251, 258; 324/760.02
See application file for complete search history.

(56) References Cited

U.S. PATENT DOCUMENTS 7,019,718 B2    3/2006  Yamazaki et al.
7,321,413 B2 *  1/2008  Nakata ........................ 349/138
(Continued)

FOREIGN PATENT DOCUMENTS

JP    2001-281674    10/2001
JP    2004-151739    5/2004
(Continued)

OTHER PUBLICATIONS

English Abstract for Publication No. 1020090107301 (FOR 10-0976581).
(Continued)

*Primary Examiner* — Thoi Duong
(74) *Attorney, Agent, or Firm* — F. Chau & Associates, LLC

(57) ABSTRACT

A display panel includes an array substrate, an opposite substrate facing the array substrate, and a liquid crystal layer disposed between the array substrate and the opposite substrate. The array substrate includes a display area and a non-display area surrounding the display area, and the non-display area includes a first non-display area disposed adjacent to a side portion of the display area and a second non-display area other than the first non-display area. The first non-display area overlaps the opposite substrate. The array substrate and the opposite substrate have the same or substantially the same area and a wire member is disposed under the array substrate to be connected to an external circuit module. Accordingly, the display panel does not need an extra space for the wire member, and thus the non-display area is reduced.

13 Claims, 13 Drawing Sheets

(51) Int. Cl.
*H01L 33/08* (2010.01)
*F21V 8/00* (2006.01)

(56) References Cited

U.S. PATENT DOCUMENTS

| | | |
|---|---|---|
| 7,394,514 B2 | 7/2008 | Hayashi et al. |
| 7,474,376 B2 | 1/2009 | Zhang et al. |
| 7,525,629 B2 | 4/2009 | Konuma et al. |
| 7,612,856 B2 | 11/2009 | Otose et al. |
| 7,973,898 B2 | 7/2011 | Jung et al. |
| 2006/0202931 A1 | 9/2006 | Koide |
| 2008/0018572 A1 | 1/2008 | Shin et al. |
| 2008/0079889 A1* | 4/2008 | Lee et al. .................. 349/151 |
| 2009/0165282 A1 | 7/2009 | Tseng |
| 2011/0102697 A1 | 5/2011 | Koyama et al. |

FOREIGN PATENT DOCUMENTS

| | | |
|---|---|---|
| JP | 2005-215355 | 8/2005 |
| JP | 3843700 | 8/2006 |
| KR | 10-2005-0006405 | 1/2005 |
| KR | 10-2006-0116103 | 11/2006 |
| KR | 10-2008-0003095 | 1/2008 |
| KR | 10-0870002 | 11/2008 |
| KR | 10-0960165 | 5/2010 |
| KR | 10-0972091 | 7/2010 |
| KR | 10-0976581 | 8/2010 |
| KR | 10-2011-0020050 | 3/2011 |

OTHER PUBLICATIONS

English Abstract for Publication No. 1020090102561 (FOR 10-0972091).
English Abstract for Publication No. 1020090100949 (FOR 10-0960165).
English Abstract for Publication No. 1020030049705 (FOR 10-087002).
English Abstract for Publication No. 10-2011-0020050.
English Abstract for Publication No. 10-2008-0003095.
English Abstract for Publication No. 10-2006-0116103.
English Abstract for Publication No. 10-2005-0006405.
English Abstract for Publication No. JP3843700.
English Abstract for Publication No. 2005-215355.
English Abstract for Publication No. 2004-151739.
English Abstract for Publication No. 2001-281674.

* cited by examiner

DISPLAY PANEL AND METHOD OF MANUFACTURING THE SAME

CROSS-REFERENCE TO RELATED APPLICATION

This U.S. non-provisional patent application claims priority under 35 U.S.C. §119 of Korean Patent Application No. 10-2012-0066249, filed on Jun. 20, 2012, the content of which is herein incorporated by reference.

TECHNICAL FIELD

Embodiments of the present disclosure relate to a display panel and a method of manufacturing the same, and more particularly to a display panel that has a reduced pad area connected to an external circuit module and a method of manufacturing the display panel.

DISCUSSION OF THE RELATED ART

A display device includes a display panel that displays images and an external circuit module that applies various control signals to the display panel. The display panel and the external circuit module are accommodated in a receiving container, e.g., a chassis. The display panel and the external circuit module are connected to each other by a wiring member, such as a tape carrier package or a flexible printed circuit board.

The wiring member is attached to the display panel and the external circuit module. Accordingly, reducing a non-display area of the display panel may be limited due to the presence of the wiring member.

SUMMARY

Embodiments of the present disclosure provide a display panel that has a reduced pad area connected to an external circuit module and a method of manufacturing the display panel.

An embodiments of the inventive concept provides a display panel includes an array substrate, an opposite substrate facing the array substrate, and a liquid crystal layer disposed between the array substrate and the opposite substrate. The array substrate includes a display area and a non-display area surrounding the display area, and the non-display area including a first non-display area disposed adjacent to a side portion of the display area and a second non-display area other than the first non-display area. The first non-display area overlaps the opposite substrate.

The first non-display area includes a wire area adjacent to the display area and a pad area other than the wire area.

The array substrate includes a base substrate disposed in the display area, the second non-display area, and the wire area, a thin film transistor disposed on the base substrate in the display area, a pixel electrode connected to the thin film transistor, a signal input pad disposed in the pad area and electrically connected to an external circuit module, a signal wire disposed in the wire area to connect the signal input pad and the thin film transistor. The signal input pad is electrically connected to the external circuit module through a flexible printed circuit board attached on a lower surface of the signal input pad.

The array substrate further includes an organic polymer pattern to support the signal input pad, and the signal input pad is disposed on a lower surface of the organic polymer pattern.

The display panel further includes a seal pattern disposed between the array substrate and the opposite substrate in the non-display area. At least a portion of the seal pattern overlaps the organic polymer pattern in the first non-display area.

The array substrate includes a base substrate disposed in the display area and the non-display area and provided with a thru-hole in the first non-display area, a thin film transistor disposed on the base substrate in the display area, a pixel electrode connected to the thin film transistor, and a signal wire disposed in the first non-display area, electrically connected to the thin film transistor, and filled in the thru-hole. The signal wire is electrically connected to a flexible printed circuit board attached on a lower surface of the array substrate.

The array substrate has the same or substantially the same area as the opposite substrate.

An embodiment of the inventive concept provides a method of manufacturing a display panel includes forming an array substrate, disposing a liquid crystal layer between the array substrate and an opposite substrate including a common electrode facing the array substrate, and coupling the array substrate to the opposite substrate. The array substrate is formed by at least one of preparing a base substrate that includes a display area and a non-display area surrounding the display area and including a first non-display area disposed adjacent to a side portion of the display area and a second non-display area other than the first non-display area, forming a trench in the first non-display area of the base substrate to be spaced apart from the display area, forming a thin film transistor in the display area of the base substrate and a signal input pad in the trench to be connected to the thin film transistor, and forming a pixel electrode connected to the thin film transistor. After the array substrate is coupled to the opposite substrate, a portion of the base substrate is removed in the first non-display area to expose the signal input pad toward a lower surface of the array substrate.

An embodiment of the inventive concept provides a method of manufacturing a display panel includes forming an array substrate, disposing a liquid crystal layer between the array substrate and an opposite substrate including a common electrode facing the array substrate, and coupling the array substrate to the opposite substrate. The array substrate is formed by at least one of preparing a base substrate that includes a display area and a non-display area surrounding the display area and including a first non-display area disposed adjacent to a side portion of the display area and a second non-display area other than the first non-display area, forming a thru-hole in the first non-display area of the base substrate to be spaced apart from the display area, forming a thin film transistor in the display area of the base substrate and a signal wire connected to the thin film transistor and filled in the thru-hole, and forming a pixel electrode connected to the thin film transistor.

According to an embodiment, there is provided a display panel comprising an array substrate including a switching element, an opposite substrate parallel with the array substrate, wherein the opposite substrate includes a signal input pad, and a seal pattern between the array substrate and the opposite substrate, wherein the signal input pad connects a driver IC (Integrated Circuit) with the switching element, and wherein the signal input pad is disposed on a bottom surface of the opposite substrate to overlap at least a portion of the seal pattern.

The array substrate and the opposite substrate have the same or substantially the same length in a longitudinal direction and overlap each other.

According to the embodiments, the array substrate and the opposite substrate have the same or substantially the same area, and the wire member connected to the external circuit module is disposed under the array substrate. Accordingly, the display panel does not need an extra space for the wire member, and thus the non-display area in which no image is displayed may be reduced.

BRIEF DESCRIPTION OF THE DRAWINGS

The embodiments of the present invention will become readily apparent by reference to the following detailed description when considered in conjunction with the accompanying drawings wherein.

DETAILED DESCRIPTION

Figure 1:
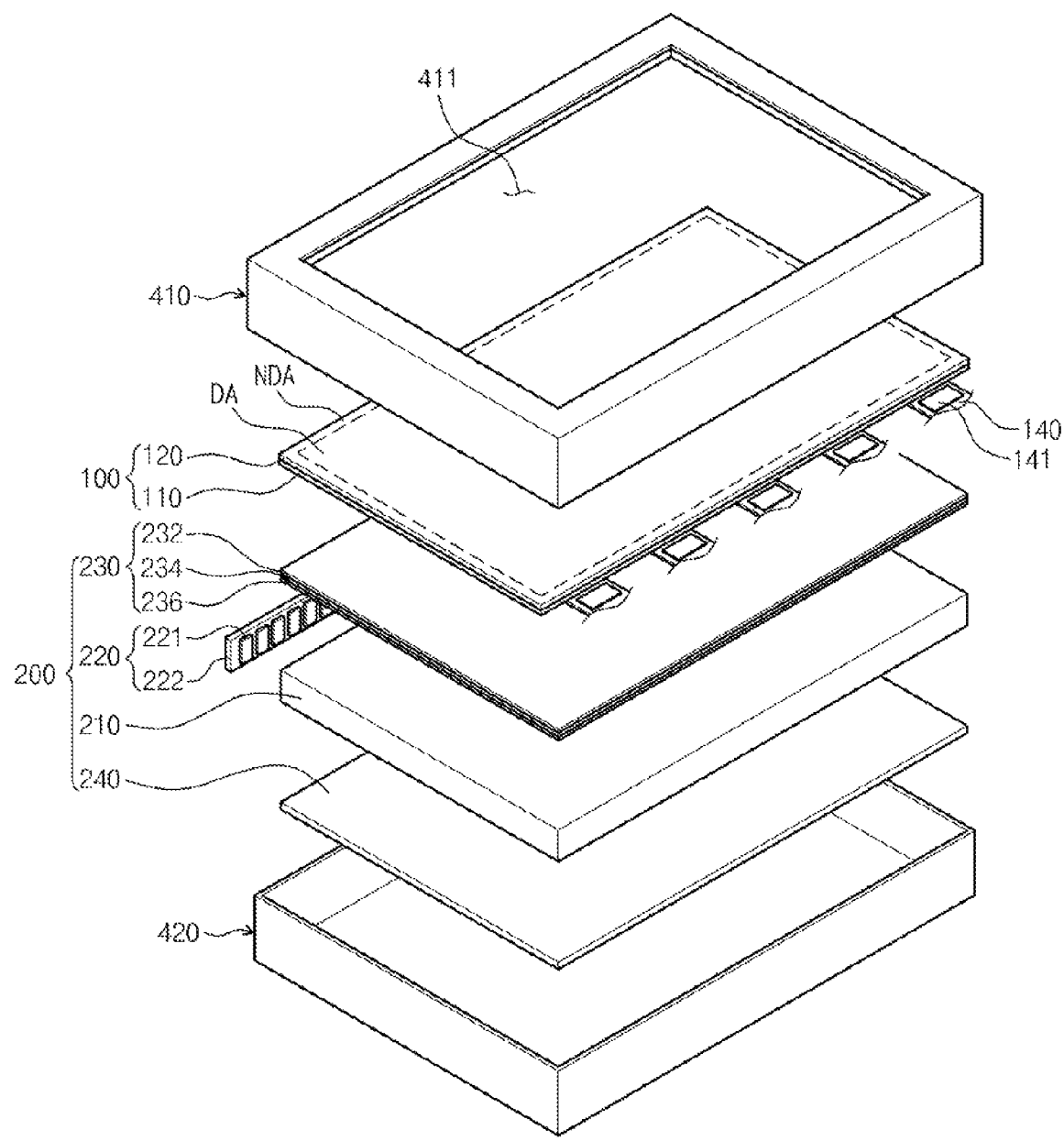
FIG. 1 is an exploded perspective view showing a display apparatus according to an exemplary embodiment of the present invention.

It will be understood that when an element or layer is referred to as being "on", "connected to" or "coupled to" another element or layer, it can be directly on, connected or coupled to the other element or layer or intervening elements or layers may be present. As used herein, the term "and/or" includes any and all combinations of one or more of the associated listed items. As used herein, the singular forms, "a", "an" and "the" are intended to include the plural forms as well, unless the context clearly indicates otherwise.

Hereinafter, embodiments of the present invention will be described in detail with reference to the accompanying drawings, wherein the same reference numerals may be used to denote the same or substantially the same elements throughout the specification and the drawings.

FIG. 1 is an exploded perspective view showing a display apparatus according to an exemplary embodiment of the present invention.

Referring to FIG. 1, the display apparatus includes a display panel 100, a backlight unit 200, an upper cover 410, and a lower cover 420.

According to an embodiment, the display panel 100 includes various display panels, such as a liquid crystal display panel, an electrophoretic display panel, or an electrowetting display panel. Hereinafter, an example where the display panel 100 is a liquid crystal display panel is described.

The display panel 100 has a rectangular plate shape with long sides and short sides and includes a display area DA where images are displayed and a non-display area NDA adjacent to the display area DA. The display panel 100 includes an array substrate 110, an opposite substrate 120 facing the array substrate 110, and a liquid crystal layer between the array substrate 110 and the opposite substrate 120. The display panel 100 further includes polarizing plates that are respectively attached to an outer surface of the array substrate 110 and an outer surface of the opposite substrate 120.

The array substrate 110 includes a plurality of pixels arranged in the display area DA in a matrix form. Each pixel includes a plurality of sub-pixels having different colors from each other. For instance, each sub-pixel has red, green, blue, yellow, or white. Light exiting from each sub-pixel has one of red, green, blue, yellow, and white. Each pixel includes a gate line, a data line insulated from the gate line and crossing the gate line, and a pixel electrode. Each pixel is electrically connected to the gate line and the data line. Each pixel includes a thin film transistor electrically connected to the pixel electrode. The thin film transistor switches on or off a driving signal applied to the pixel electrode.

A seal pattern is disposed in the non-display area of the array substrate 110 and couples the array substrate 110 to the opposite substrate 120.

A signal input pad is disposed in the non-display area NDA of the array substrate 110 and electrically connected to the thin film transistor. The signal input pad is connected to a flexible printed circuit board 140 on which a driver IC (Integrated Circuit) 141 is mounted and the flexible printed circuit board 140 is connected to an external circuit module. The driver IC 141 receives various control signals from the external circuit module and outputs the driving signal to the thin film transistor in response to the control signals to drive the display panel 100.

The driver IC 141 is disposed on a lower surface of the array substrate 110, which faces the backlight unit 200.

The opposite substrate 120 includes color filters, each of which realizes a predetermined color using light provided from the backlight unit 200, and a common electrode disposed on the color filters and facing the pixel electrode. Each color filter has one color of red, green, and blue and is formed by a deposition or coating process. According to an exemplary embodiment, the color filters are disposed on the opposite substrate 120, but the embodiments of the present invention should not be limited thereto or thereby. Alternatively, the color filters are disposed on the array substrate 110.

The liquid crystal layer includes liquid crystal molecules arranged in a specific direction in response to an electric field generated by voltages respectively applied to the pixel electrode and the common electrode. The liquid crystal layer controls a transmittance of light passing through the liquid crystal molecules, thereby displaying desired images.

The backlight unit 200 is disposed under the display panel 100. The backlight unit 200 includes a light guide plate 210, a light source unit 220 including a plurality of light sources, an optical member 230, and a reflective sheet 240.

The light guide plate 210 is disposed under the display panel 100 and guides light emitted from the light source unit 220 to the display panel 100. The light guide plate 210 overlaps at least the display area DA of the display panel 100. The light guide plate 210 includes an exit surface from which light exits, a lower surface facing the exit surface, and side surfaces connecting the exit surface with the lower surface. At least one of the side surfaces faces the light source unit 220 and functions as a light incident surface into which light emitted from the light source unit 220 is incident and a side surface facing the light incident surface functions as a light reflective surface that reflects light.

The light source unit 220 includes a printed circuit board 222 and the light sources 221, e.g., light emitting diodes, mounted on the printed circuit board 222. According to an embodiment, the light sources 221 emit light of different colors from each other. For example, some of the light sources 221 emit red light, some of the light sources 221 emit green light, and some of the light sources 221 emit blue light.

The light source unit 220 is disposed to face at least one side surface of the light guide plate 210 and provides light to the display panel 100 through the light guide plate 210.

The optical member 230 is disposed between the light guide plate 210 and the display panel 100. The optical member 230 controls light exiting through the light guide plate 210 from the light source unit 220. The optical member 230 includes a diffusion sheet 236, a prism sheet 234, and a protective sheet 232, which are sequentially stacked one on another.

The diffusion sheet 236 diffuses light exiting from the light guide plate 210. The prism sheet 234 condenses light diffused by the diffusion sheet 236 to allow the light to travel in a direction perpendicular or substantially perpendicular to the display panel 100. Light exiting from the prism sheet 234 is vertically incident into the display panel 100. The protective sheet 232 is disposed on the prism sheet 234 and protects the prism sheet 234 from external impacts.

According to an exemplary embodiment, the optical member 230 includes one diffusion sheet 236, one prism sheet 234, and one protective sheet 232, but it should not be limited thereto or thereby. Alternatively, a plurality of diffusion sheets 236, a plurality of prism sheets 234, or a plurality of protective sheets 232 may be included in the optical member 230, or one of the diffusion sheet 236, the prism sheet 234, and the protective sheet 232 may be removed from the optical member 230.

The reflective sheet 240 is disposed under the light guide plate 210 and reflects light that leaks from the light guide plate and is not directed to the display panel 100. The reflective sheet 240 includes a light reflective material to reflect light. The reflective sheet 240 is disposed on the lower cover 420 and reflects light emitted from the light source unit 220. As a result, the reflective sheet 240 increases the amount of light provided to the display panel 100.

According to an exemplary embodiment, the light source unit 220 is disposed to provide light to a side surface of the light guide plate 210, but it should not be limited thereto or thereby. Alternatively, the light source unit 220 is disposed to provide light to a lower surface of the light guide plate 210. According to an embodiment, when the light guide plate 210 is omitted from the backlight unit 200, the light source unit 220 is disposed under the display panel 100, so that light emitted from the light source unit 220 may be directly provided to the display panel 100.

The upper cover 410 is disposed on the display panel 100. The upper cover 410 is provided with a display window 411 that exposes the display area DA of the display panel 100. The upper cover 410 is coupled with the lower cover 420 to support a front edge portion of the display panel 100.

The lower cover 420 is disposed under the backlight unit 200. The lower cover 420 provides a space to accommodate the display panel 100 and the backlight unit 200. The lower cover 420 is coupled with the upper cover 410 to accommodate the display panel 100 and the backlight unit 200 therein.

Figure 2:
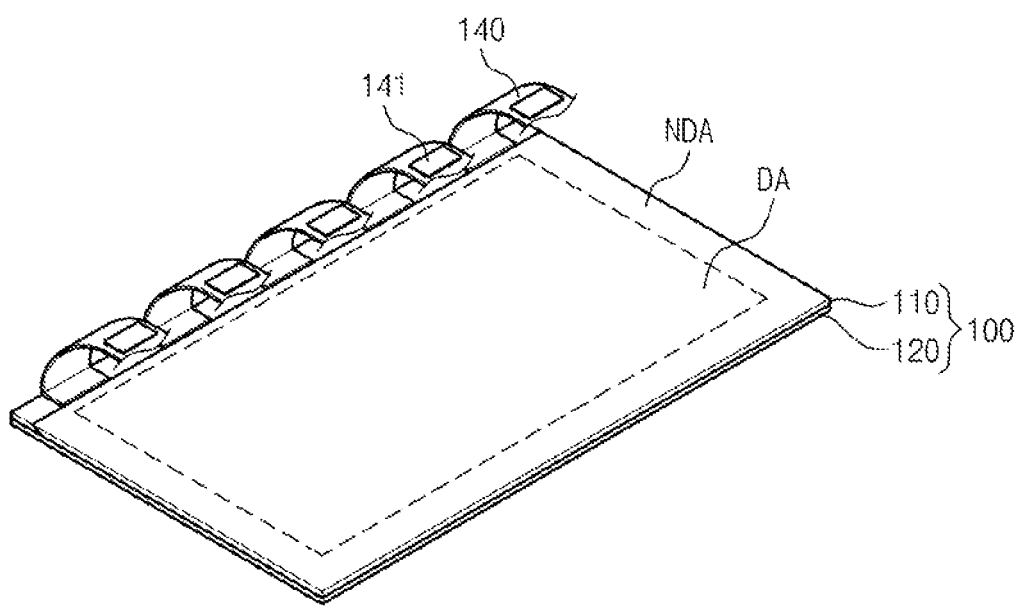
FIG. 2 is a perspective view showing the array substrate of the display panel shown in FIG. 1.
Figure 3:
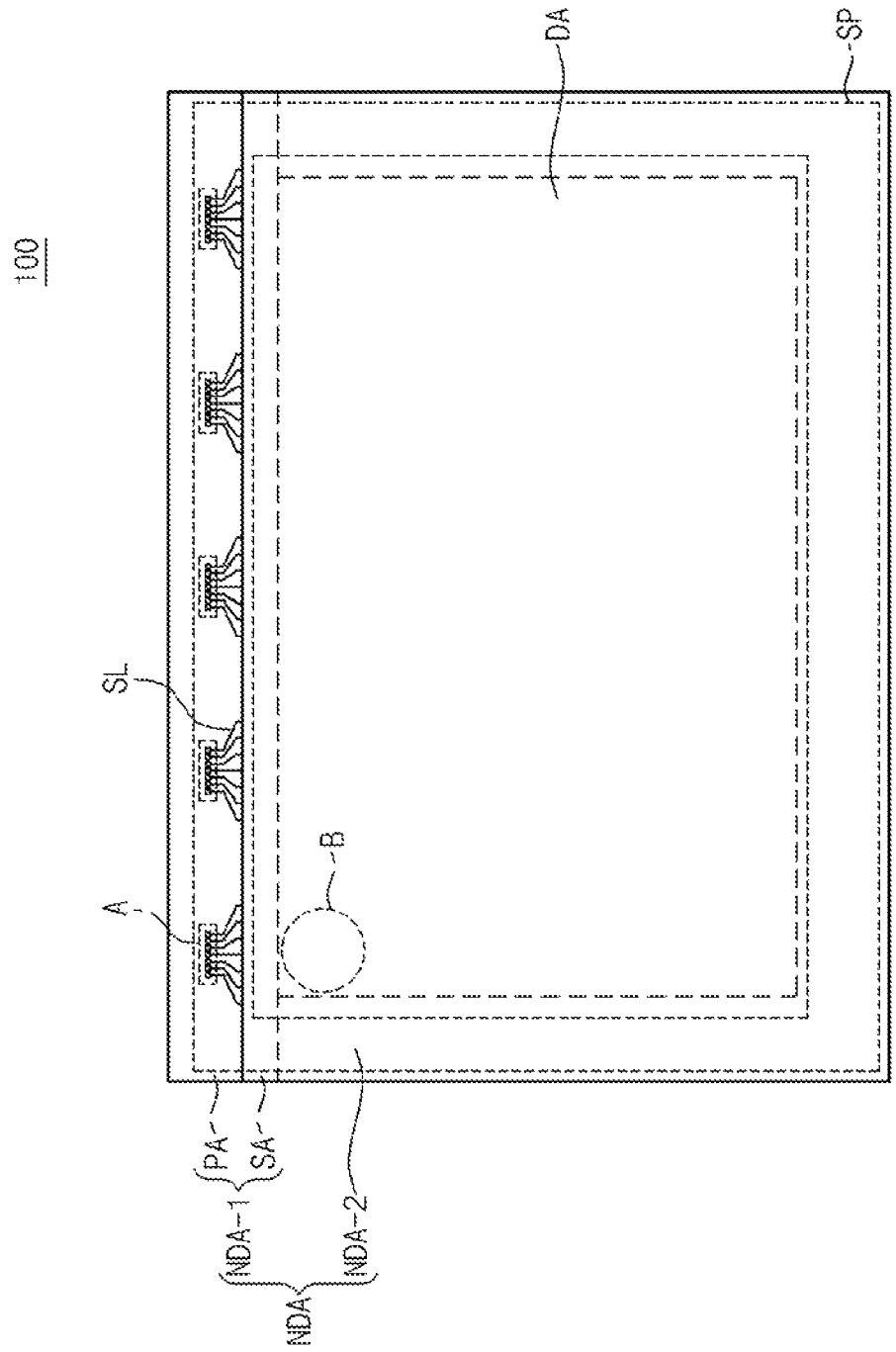
FIG. 3 is a plan view showing the display panel of FIG. 2 before a flexible printed circuit board is attached to the display panel.
Figure 4:
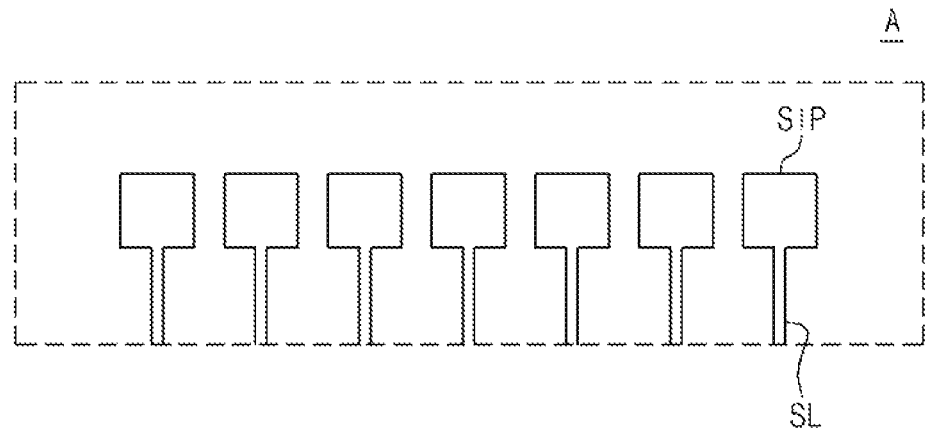
FIG. 4 is an enlarged view showing a portion A of FIG. 3.
Figure 5:
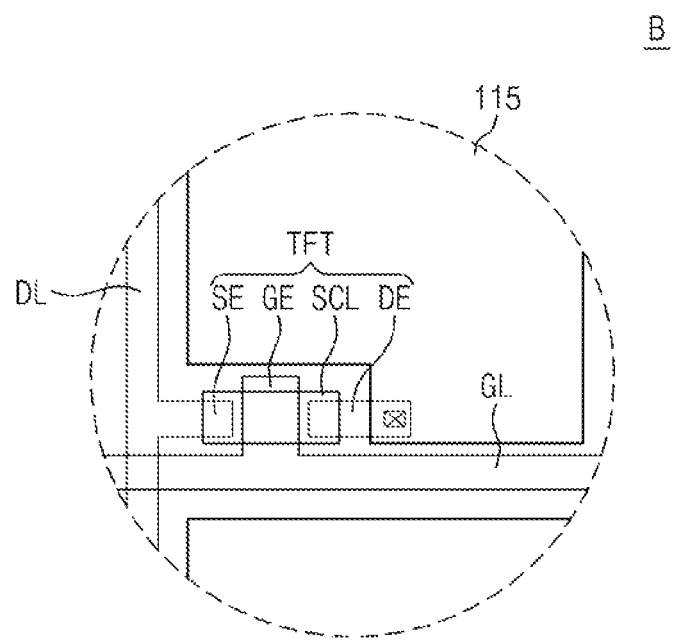
FIG. 5 is an enlarged view showing a portion B of FIG. 3.
Figure 6:
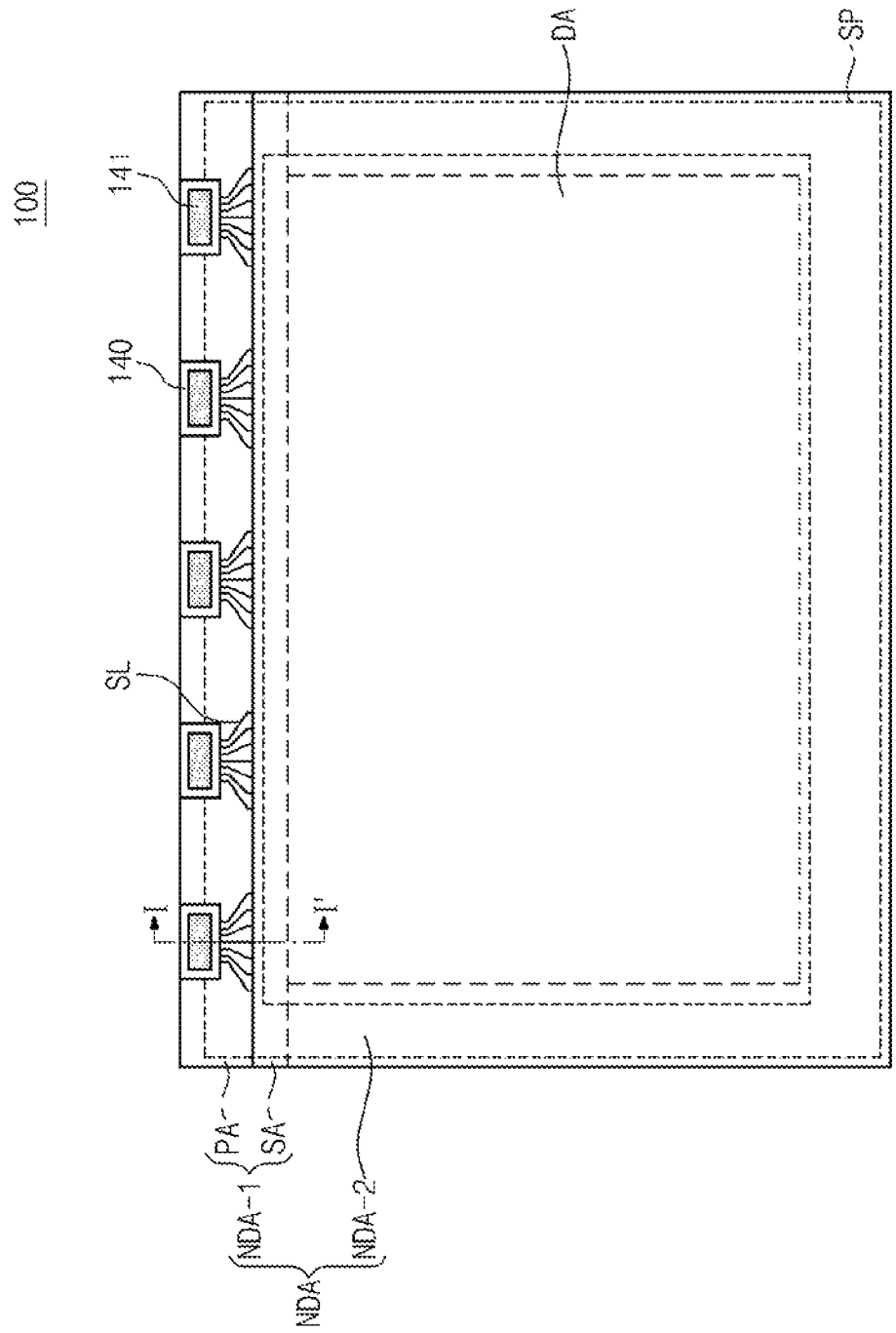
FIG. 6 is a plan view showing a display panel after a flexible printed circuit board is attached to the display panel.
Figure 7:
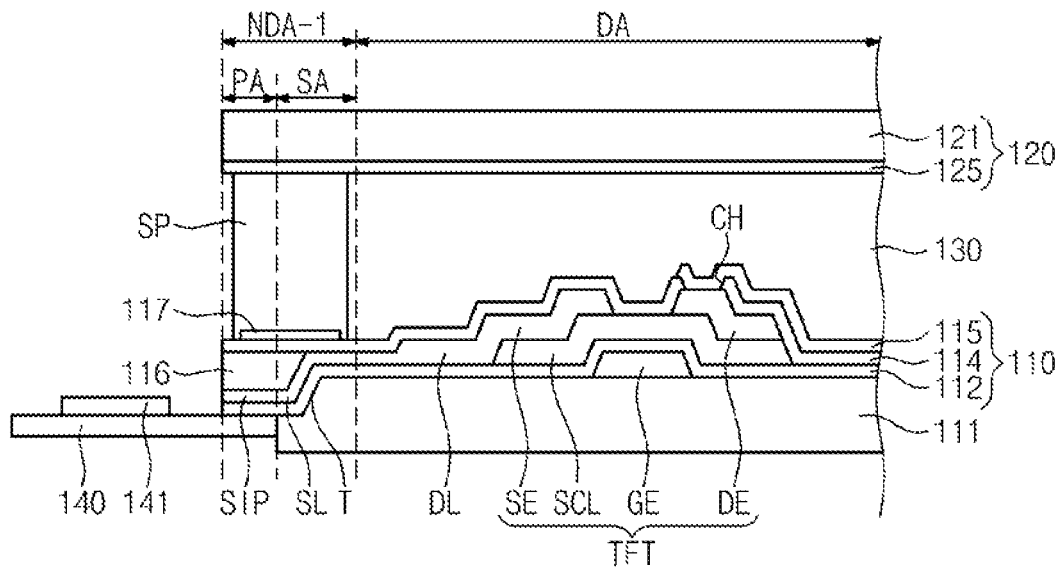
FIG. 7 is a cross-sectional view taken along a lint I-I' of FIG. 6.
Figure 8:
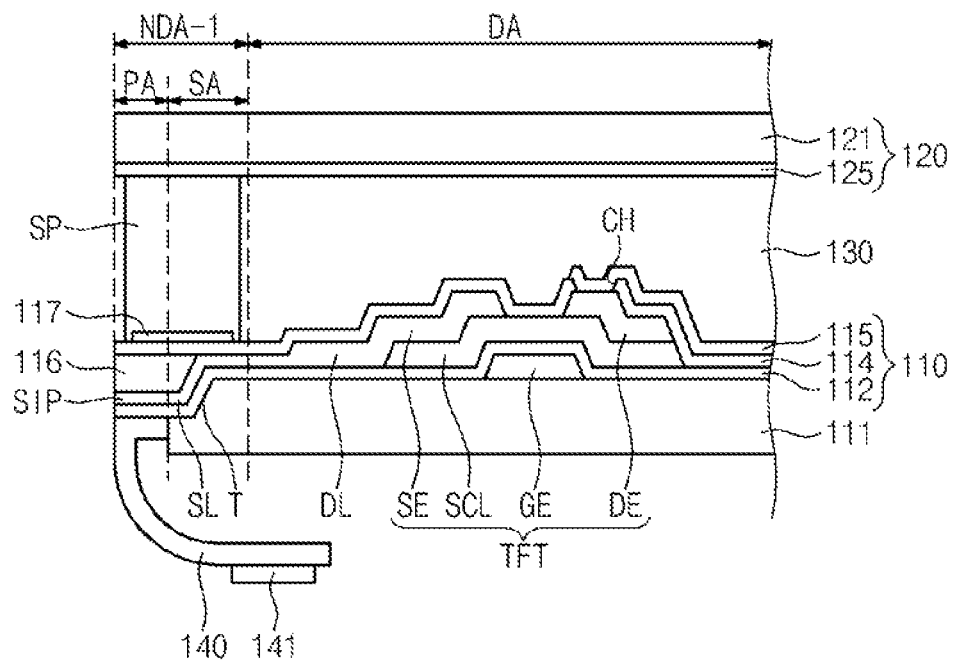
FIG. 8 is a cross-sectional view showing the display panel of FIG. 7, wherein a flexible printed circuit board is bent downward.

FIG. 2 is a perspective view showing the array substrate of the display panel shown in FIG. 1, FIG. 3 is a plan view showing a display panel before a flexible printed circuit board is attached to the display panel according to an embodiment of the present invention, FIG. 4 is an enlarged view showing a portion A of FIG. 3, FIG. 5 is an enlarged view showing a portion B of FIG. 3, FIG. 6 is a plan view showing a display panel after a flexible printed circuit board is attached to the display panel, FIG. 7 is a cross-sectional view taken along a lint I-I' of FIG. 6, and FIG. 8 is a cross-sectional view showing a flexible printed circuit board bent downward of the display panel of FIG. 7.

Referring to FIGS. 2 to 8, the display panel 100 includes the display area DA and the non-display area NDA surrounding the display area DA. The non-display area NDA includes a first non-display area NDA-1 including the pad area PA and a second non-display area NDA-2 other than the first non-display area NDA-1.

The display panel 100 includes the array substrate 110, the opposite substrate 120 facing the array substrate 110, and the liquid crystal layer 130 disposed between the array substrate 110 and the opposite substrate 120.

The array substrate 110 has a shape corresponding to a shape of the display panel 100, and includes the display area DA and the non-display area NDA including the first and second non-display areas NDA-1 and NDA-2. The array substrate 110 includes an upper surface facing the opposite substrate and a lower surface opposite to the upper surface.

The pixels are arranged in the display area DA of the array substrate 110 in the matrix form. Each pixel includes the thin film transistor TFT and the pixel electrode 115.

The seal pattern SP is disposed in the non-display area NDA of the array substrate 110. The seal pattern SP is disposed to surround the display area DA and couples the array substrate 110 to the opposite substrate 120 to prevent leakage of the liquid crystal molecules of the liquid crystal layer 130. The seal pattern SP has conductivity to allow a common voltage to be applied to the common electrode 125 of the opposite substrate 120.

The first non-display area NDA-1 of the array substrate 110 overlaps the opposite substrate 120 and includes a wire area SA adjacent to the display area DA and a pad area PA other than the wire area SA. The pad area PA and the wire area SA of the array substrate 110 overlap the opposite substrate 120.

Signal input pads SIP are disposed in the pad area PA of the array substrate 110 and electrically connected to corresponding ones of the thin film transistors TFT. The signal input pads SIP are disposed on the lower surface of the array substrate 110 in the pad area PA.

The signal input pads SIP are supported by an organic polymer pattern 116. For instance, the signal input pads SIP are disposed on the lower surface of the organic polymer pattern 116 and supported by a cohesive force between the signal input pads SIP and the organic polymer pattern 116.

A common voltage pad 117 is disposed on the upper surface of the organic polymer pattern 116. The common voltage pad 117 contacts the seal pattern SP and applies a common voltage to the common electrode 125. The common voltage pad 117 includes a transparent conductive oxide, e.g., indium tin oxide (ITO) or indium zinc oxide (IZO).

The organic polymer pattern 116 is positioned in the pad area PA and is extended to a portion of the wire area SA. According to an embodiment, the organic polymer pattern 116 includes a photosensitive resin, e.g., photoresist. The organic polymer pattern 116 is cured by light to support the signal input pad SIP. According to an embodiment, the organic polymer pattern 116 includes an organic polymer material, e.g., polyethyleneterephthalate (PET), polyethylenenapthalate (PEN), polycarbonate (PC), polyetherimide (PEI), polyethersulfone (PES), polyetheretherketon (PEEK), or polyimide (PI).

Signal wires SL are disposed in the wire area SA of the array substrate 110 and connect corresponding thin film transistors TFT to corresponding signal input pads SIP.

The seal pattern SP overlaps at least a portion of the organic polymer pattern 116. Accordingly, a contact area between the signal input pads SIP and the flexible printed circuit boards 140 on which the driver ICs 141 are mounted increases. As a contact area or width between the seal pattern SP and the organic polymer pattern 116 decreases, the area or width of the pad area PA is reduced in the first non-display area NDA-1. Accordingly, the exposed area or width of the signal input pad SIP is reduced, and thus the contact area or width between the signal input pad SIP and the flexible printed circuit boards 140 on which the drivers IC 141 are mounted may be decreased. As the contact area or width between the seal pattern SP and the organic polymer pattern 116 increases, the area or width of the pad area PA is increased in the first non-display area NDA-1. Accordingly, the exposed area or width of the signal input pad SIP is increased, and thus the contact area or width between the signal input pad SIP and the flexible printed circuit boards 140 on which the driver ICs 141 are mounted may be increased.

The array substrate 110 includes a first base substrate 111, the thin film transistor TFT disposed on the first base substrate 111 in the display area DA, and the pixel electrode 115 connected to the thin film transistor TFT.

The first base substrate 111 corresponds to the display area DA and a portion of the non-display area NDA. For instance, the first base substrate 111 corresponds to the display area DA, the second non-display area NDA-2, and the wire area SA and has a rectangular plate shape with long sides and short sides. The first base substrate 111 does not overlap the pad area PA.

The first base substrate 111 is formed of a transparent insulating material to transmit light. According to an embodiment, the first base substrate 111 includes a rigid substrate, such as a glass substrate, a quartz substrate, a glass ceramic substrate, or a crystalline glass substrate, or a flexible substrate, such as a film substrate containing an organic polymer layer, or a plastic substrate. According to an embodiment, material used to form the first base substrate 111 has high heat-resistance when the first base substrate 111 is formed.

The thin film transistor TFT is disposed on the first base substrate 111 and includes a semiconductor layer SCL, a gate electrode GE, a source electrode SE, and a drain electrode DE. The gate electrode GE is disposed on the first base substrate 111. The thin film transistor TFT further includes a gate insulating layer 112 that covers the gate electrode GE. The semiconductor layer SCL is disposed on the gate insulating layer 112. The source and drain electrodes SE and DE are respectively connected to two ends of the semiconductor layer SCL. According to an exemplary embodiment, the semiconductor layer SCL includes a channel area overlapping the gate electrode GE when viewed in a plan view, a source area contacting the source electrode SE, and a drain area contacting the drain electrode DE. The gate electrode GE of the thin film transistor TFT is connected to the gate line GL through which a scan signal or a gate signal is transmitted to the thin film transistor TFT. The source electrode SE is connected to the data line DL through which the data voltage is supplied to the thin film transistor TFT.

The above-described thin film transistor TFT is a bottom gate thin film transistor in which the gate electrode GE is disposed under the semiconductor layer SCL, but the thin film transistor TFT should not be limited to the bottom gate thin film transistor. Alternatively, a top gate thin film transistor in which the gate electrode GE is disposed on the semiconductor layer SCL may be used as the thin film transistor TFT.

The protective layer 114 is disposed on the thin film transistor TFT. The protective layer 114 is provided with a contact hole CH to expose a portion of the drain electrode DE. According to an embodiment, the protective layer 114 has a multi-layered structure. For instance, according to an embodiment, the protective layer 114 includes an inorganic protective layer, which covers the thin film transistor TFT and the gate insulating layer 112, and an organic protective layer disposed on the inorganic protective layer. According to an embodiment, the organic protective layer removes and planarizes steps that occur due to the thin film transistor TFT.

The pixel electrode 115 is disposed on the protective layer 114 and electrically connected to the drain electrode DE through the contact hole CH. The pixel electrode 115 includes a transparent conductive oxide, such as iridium tin oxide (ITO) or indium zinc oxide (IZO).

At least one of the gate line GL and the data line DL, for example, the data line. DL is connected to the signal input pad SIP through the signal wire SL.

The flexible printed circuit boards 140 on which the driver ICs 141 are mounted contact the lower surfaces of the signal input pads SIP. Since the signal input pads SIP are disposed on the lower surface of the organic polymer pattern 116, the flexible printed circuit board 141 receives various control signals from the external circuit module and outputs driving signals to the thin film transistors TFT through the signal input pads SIP in response to the control signals, thereby resulting in driving the display panel 100.

The opposite substrate 120 is disposed in the display area DA and the non-display area NDA. The opposite substrate 120 includes a second base substrate 121 and a common electrode 125 disposed on the second base substrate 121. According to an embodiment, the second base substrate 121 includes a rigid substrate or a flexible substrate similar to the first base substrate 111. The common electrode 125 includes a transparent conductive oxide as the pixel electrode 115. The common electrode 125 applies a common voltage from an external source to each pixel.

The liquid crystal layer 130 includes the liquid crystal molecules. The liquid crystal molecules are arranged in a specific direction by an electric field generated between the pixel electrode 115 and the common electrode 125 to control the transmittance of light passing through the liquid crystal layer 130. Accordingly, the liquid crystal layer 130 transmits light provided from the backlight unit 200 in response to the electric field, and thus the display panel 110 displays desired images.

As described above, the array substrate 110 and the opposite substrate 120 have the same or substantially the same size, and the flexible printed circuit boards 140, on which the driver ICs 141 are mounted which output driving signals to drive the display panel 100, are attached onto the lower surface of the array substrate 110 in the pad area PA. Thus, the display apparatus does not need to prepare an extra space for the flexible printed circuit board 140 in the upper and lower covers. As a consequence, the size of the upper and lower covers may be reduced.

FIGS. 9 to 14 are cross-sectional views for describing a method of manufacturing a display apparatus as shown in FIGS. 2 and 8. FIGS. 9 to 14 show the first non-display area and the display area of the display panel.

The array substrate 110 is prepared. The array substrate 110 includes the display area DA and the non-display area NDA surrounding the display area DA. The non-display area NDA includes the first non-display area NDA-1 adjacent to a side portion of the display area DA and the second non-display area NDA-2 other than the first non-display area NDA-1.

The array substrate 110 includes the first base substrate 111, the organic polymer pattern 116 disposed adjacent to a side portion of the first base substrate 111, the thin film transistor TFT disposed on the first base substrate 111, and the pixel electrode 115 connected to the thin film transistor TFT.

Figure 9:
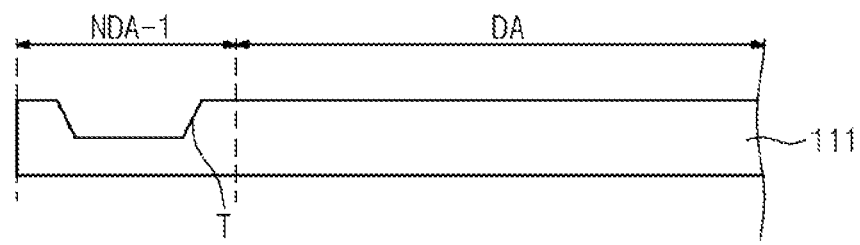
FIGS. 9 to 14 are cross-sectional views for describing a method of manufacturing a display apparatus as shown in FIGS. 2 and 8.

Referring to FIG. 9, the first base substrate 111 is prepared. The first base substrate 111 transmits light. The first base substrate 111 has a rectangular plate shape with long sides and short sides. The first base substrate 111 is divided into the display area DA and the non-display area NDA.

A trench T is formed in the first non-display area NDA-1 of the first base substrate 111. The trench T is parallel or substantially parallel to one of the long side or the short side, e.g., the long side. The trench T is formed by various methods. For example, according to an embodiment, the trench T is formed by removing a portion of the first base substrate 111 in the first non-display area NDA-1 using a laser. Alternatively, the trench T is formed by forming a photoresist pattern on the first base substrate 111 in the first non-display area NDA-1 to expose a portion of first base substrate 111 in the first non-display area NDA-1 and by etching the portion of the first base substrate 111 in the first non-display area NDA-1 using the photoresist pattern as a mask.

Figure 10:
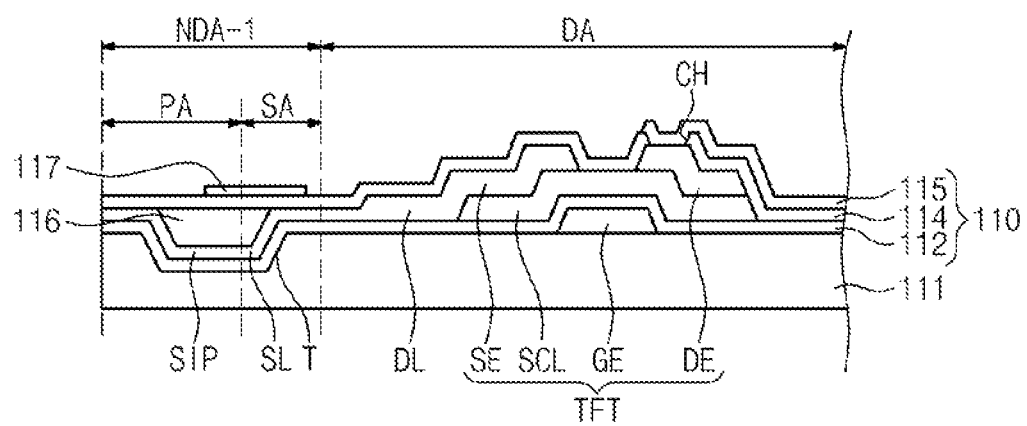

Referring to FIG. 10, after forming the trench T, the thin film transistor TFT is formed on the first base substrate 111 in the display area DA. The thin film transistor TFT includes the gate electrode GE, the semiconductor layer SCL, the source electrode SE, and the drain electrode DE.

According to an embodiment, the gate electrode GE is formed on the first base substrate 111, and the gate insulating layer 112 is formed on the first base substrate 111 to cover the gate electrode GE. Then, the semiconductor layer SCL is formed on the gate insulating layer 112, and the source electrode SE and the drain electrode DE are respectively formed in the source area and the drain area of the semiconductor layer SCL. The channel area is disposed between the source area and the drain area.

According to an embodiment, the data line DL connected to the source electrode SE, the signal input pad SIP electrically connected to the data line DL and disposed in the trench T of the pad area PA, and the signal wire SL that connects the data line DL with the signal input pad SIP and is disposed in the wire area SA are simultaneously or substantially simultaneously formed when the source electrode SE and the drain electrode DE are formed. According to an embodiment, the signal input pad SIP is disposed in the trench T.

After the thin film transistor TFT is formed, an organic polymer material is filled in the trench T to form the organic polymer pattern 116. According to an embodiment, the organic polymer pattern 116 is formed of at least one of transparent materials, such as polyethyleneterephthalate (PET), polyethylenenapthalate (PEN), polycarbonate (PC), polyetherimide (PEI), polyethersulfone (PES), polyetheretherketon (PEEK), or polyimide (PI).

After forming the organic polymer pattern 116, the protective layer 114 is formed to cover the thin film transistor TFT and the organic polymer pattern 116. The protective layer 114 is formed of an inorganic material, an organic material, or a combination thereof.

Then, a portion of the protective layer 114 is removed to form the contact hole CH through which a portion of the drain electrode DE is exposed.

A transparent conductive oxide is deposited on the protective layer 114 and patterned. Accordingly, the pixel electrode 115 is formed to be electrically connected to the drain electrode DE of the thin film transistor TFT through the contact hole CH. The common voltage pad 117 is formed in the first non-display area NDA-1 by a patterning process.

Figure 11:
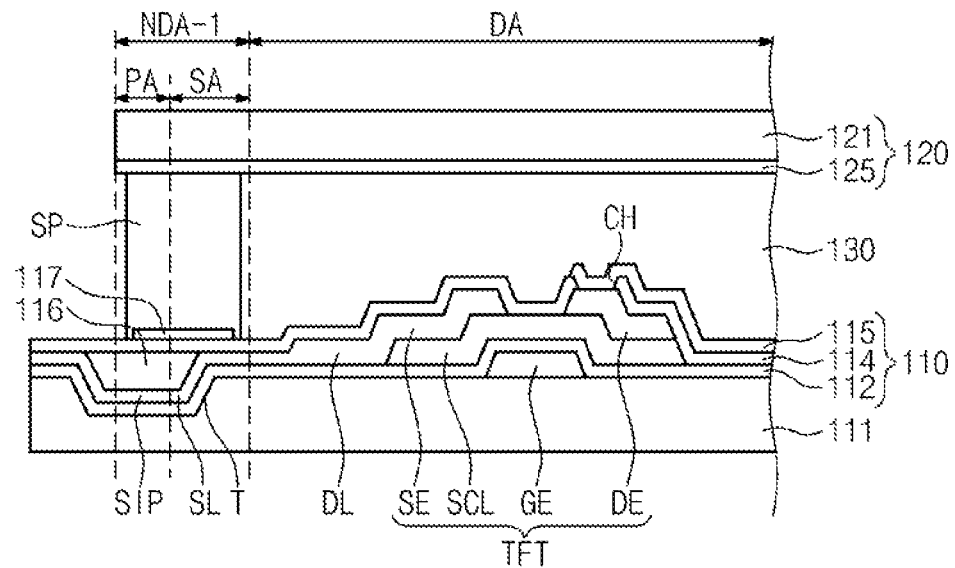

Referring to FIG. 11, after the array substrate 110 is prepared, the seal pattern SP is formed in the non-display area NDA to surround the display area DA.

The seal pattern SP has conductivity. The seal pattern P contacts the common electrode 125 and applies a common voltage to each pixel. For instance, according to an embodiment, the seal pattern SP includes a mixture of a polymer resin including at least one of an epoxy-containing resin, a phenol-containing resin, or an acryl-containing resin, a conductive particle including at least one of gold, silver, copper, or aluminum, and an organic binder. According to an embodiment, the seal pattern SP is cured by heat or light.

After the seal pattern SP is formed, the liquid crystal layer 130 including liquid crystal molecules is disposed in the display area DA.

The opposite substrate 120 that includes the second base substrate 121 and the common electrode 125 disposed on the second base substrate 121 is prepared. According to an exemplary embodiment, the opposite substrate 120 is divided into the display area DA and the non-display area NDA.

The opposite substrate 120 is disposed such that the common electrode 125 faces the array substrate 110. The array substrate 110 and the opposite substrate 120 are coupled to each other by the seal pattern SP. The seal pattern SP, which is disposed to surround the display area DA and couples the array substrate 110 to the opposite substrate 120, prevents leakage of the liquid crystal of the liquid crystal layer 130.

After the seal pattern SP is formed and the liquid crystal layer 130 is disposed, the array substrate 110 and the opposite substrate 120 are coupled to each other, but it should not be limited thereto or thereby. For instance, alternatively, the liquid crystal is injected into between the array substrate 110 and the opposite substrate 120 to form the liquid crystal layer 130 after the seal pattern SP is formed and the array substrate 110 and the opposite substrate 120 are coupled to each other.

When heat or light is irradiated to the seal pattern SP after the array substrate 110 and the opposite substrate 120 are coupled to each other, the seal pattern SP is cured.

Figure 12:
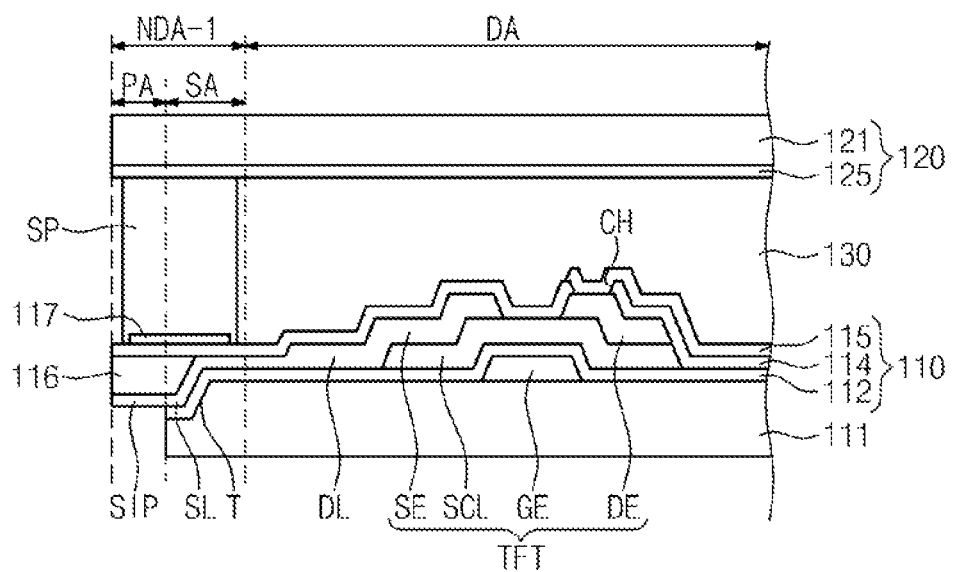

Referring to FIG. 12, after the seal pattern SP is cured, a portion of the array substrate, which protrudes beyond the opposite substrate 120 in the pad area PA, is removed.

The first base substrate 111 and the gate insulating layer 112 are removed in the pad area PA. When the first base substrate 111 and the gate insulating layer 112 are removed in the pad area PA, the signal input pad SIP is exposed under the array substrate 110. According to an embodiment, the first base substrate 111 is removed by using a laser cutting method or a wet etch method.

Figure 13:
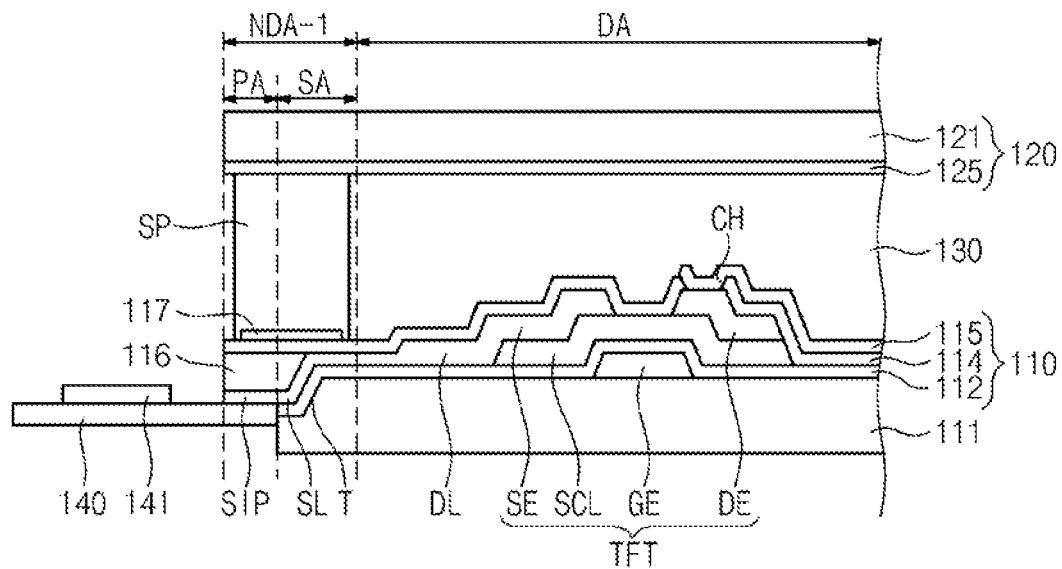

Referring to FIG. 13, after removing the first base substrate 111, the flexible printed circuit board 140 connected to the external circuit module is attached to the signal input pad SIP of the pad area PA to electrically connect the signal input pad SIP to the driver IC 141.

Figure 14:
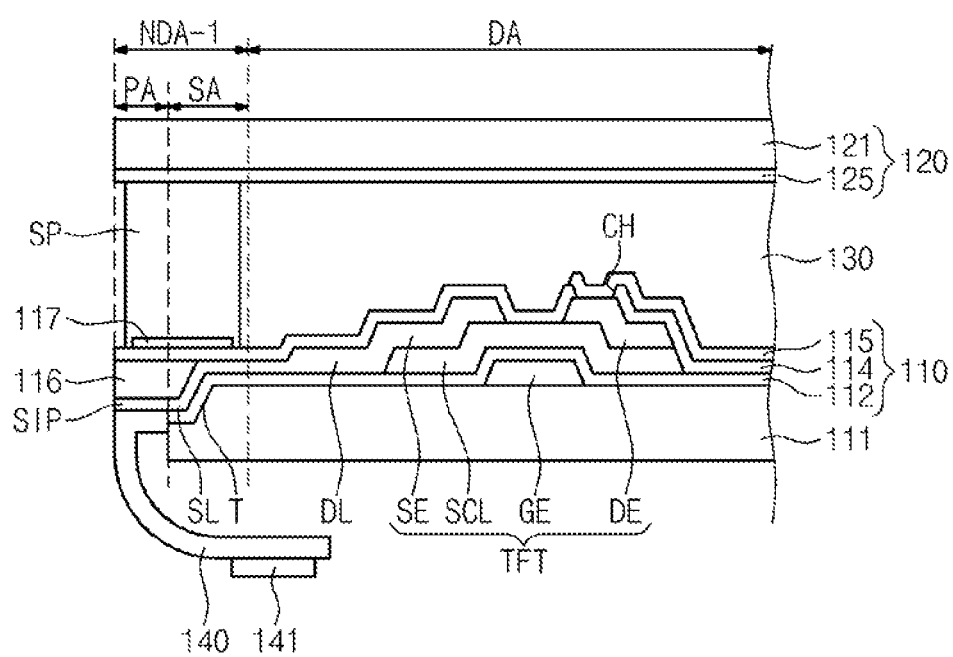

Referring to FIG. 14, the signal input pad SIP is connected to the flexible printed circuit board 140, and the flexible printed circuit board 140 is bent to the backlight unit 200 at the pad area PA.

The display panel 100 and the backlight unit 200 are accommodated in the space between the upper cover and the lower cover.

According to the display panel 100 manufactured by the above-described processes, the pad area PA, where the signal input pad SIP and the flexible circuit board 140 are connected to each other, does not protrude beyond the opposite substrate 120. Thus, no space for the pad area PA is needed in the upper and lower covers of in the display panel 100.

Hereinafter, display panels according to exemplary embodiments are described with reference to FIGS. 15 to 21.

Figure 15:
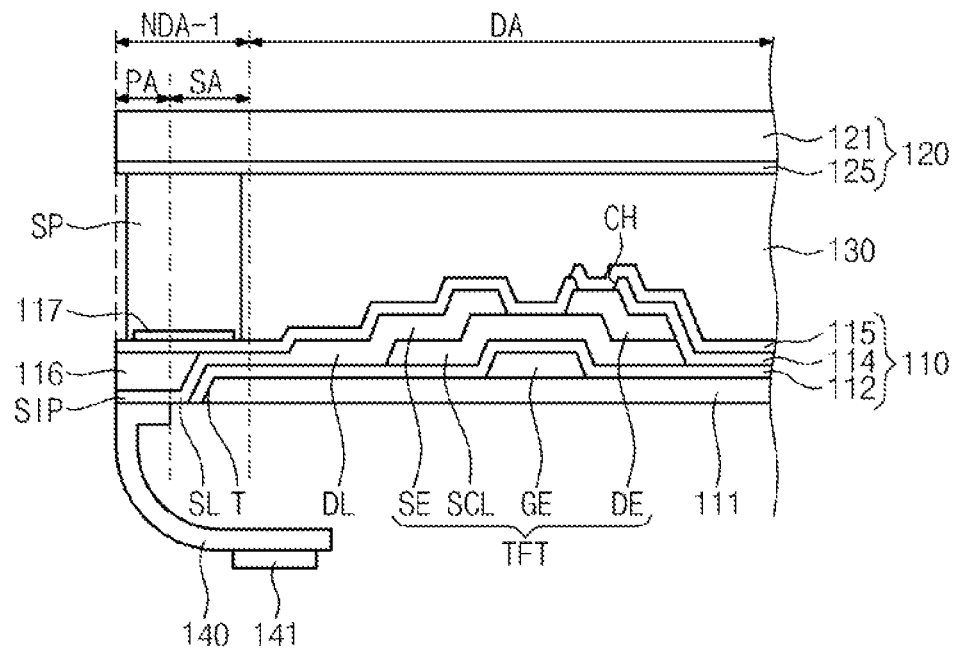
FIG. 15 is a cross-sectional view showing a display panel according to an exemplary embodiment of the present invention.

FIG. 15 is a cross-sectional view showing a display panel according to an exemplary embodiment of the present invention.

The display panel shown in FIG. 15 has a similar structure to the display panel 100 shown in FIGS. 2 to 14 except that in the display panel shown in FIG. 15, the first base substrate 111 of the array substrate 110 is even with the exposed surface of the signal input pad SIP. Accordingly, a thickness of the first base substrate 111 of the array substrate 110 decreases, thereby resulting in a decrease in a total thickness of the display panel.

According to an embodiment, the display panel shown in FIG. 15 is manufactured by additionally performing a process of removing a portion of the first base substrate 111 so that a thickness of the first base substrate 111 is reduced before the flexible printed circuit board 140 on which the driver IC 141 is mounted is attached to the signal input pad SIP. For instance, according to an embodiment, a grinding process or an etching process is performed on the lower surface of the first base substrate 111, so that the surface of the first base substrate 111 may be even with the surface of the signal input pad SIP.

According to an embodiment, the grinding process or the etching process is performed on the lower surface of the first base substrate 111 after the seal pattern SP is cured without separately performing a removing process of the first base substrate 111 of the pad area PA, and thus the surface of the first base substrate 111 may be even with the surface of the signal input pad SIP. According to an embodiment, the process of removing the first base substrate 111 is performed until the signal input pad SIP is exposed by removing the gate insulating layer 112 in the pad area PA. Accordingly, the first base substrate 111 is removed in the pad area PA, so that the total thickness of the display panel may be reduced.

Figure 16:
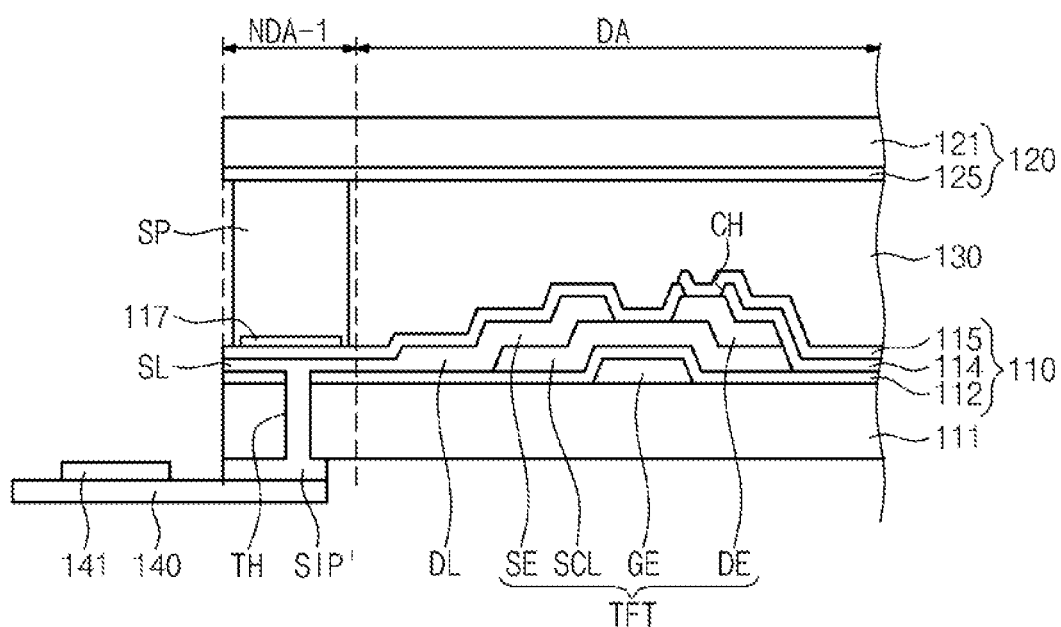
FIG. 16 is a cross-sectional view showing a display panel according to an exemplary embodiment of the present invention.
Figure 17:
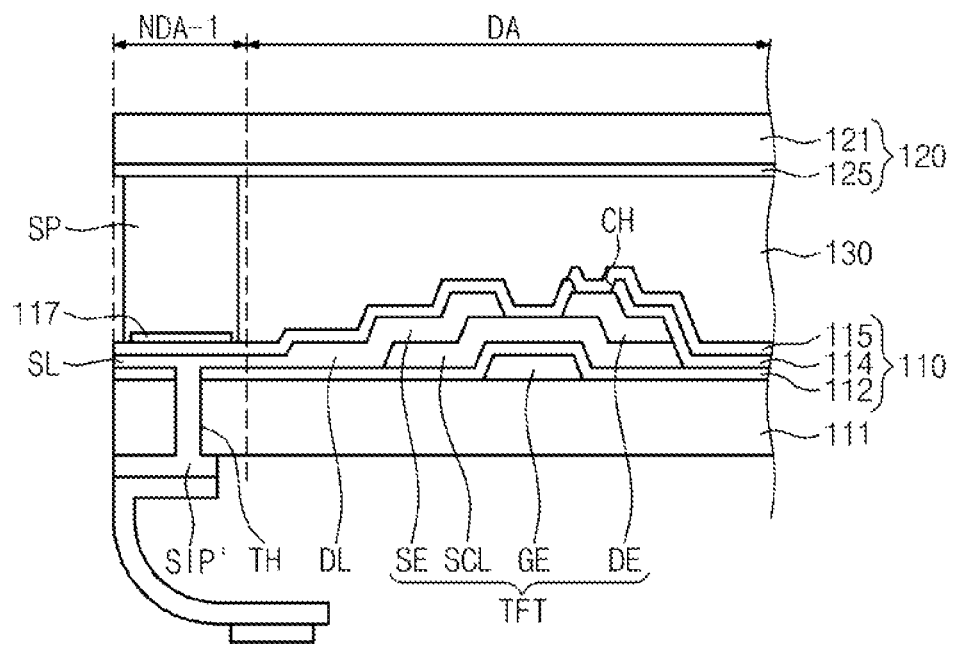
FIG. 17 is a cross-sectional view showing the display panel of FIG. 16, wherein a flexible printed circuit board is bent downward.

FIG. 16 is a cross-sectional view showing a display panel according to an exemplary embodiment of the present invention, and FIG. 17 is a cross-sectional view showing the display panel of FIG. 16, wherein the flexible printed circuit board is bent downward.

Referring to FIGS. 16 and 17, the display panel 100 includes the display area DA and the non-display area NDA surrounding the display area DA. The non-display area NDA includes the first non-display area NDA-1 adjacent to an side portion of the display area DA and the second non-display area NDA-2 other than the first non-display area NDA-1.

The display panel 100 includes the array substrate 110, the opposite substrate 120 facing the array substrate 110, and the liquid crystal layer 130 disposed between the array substrate 110 and the opposite substrate 120.

The array substrate 110 includes the display area DA and the non-display area NDA and has a rectangular plate shape with long sides and short sides. The first base substrate 111 is provided with a thru-hole TH formed in the first non-display area NDA-1.

The thin film transistor TFT is disposed on the first base substrate 111 and includes the semiconductor layer SCL, the gate electrode GE, the source electrode SE, and the drain electrode DE. The source electrode SE contacts the data line DL that transmits a data voltage to the thin film transistor TFT.

The protective layer 114 is disposed on the thin film transistor TFT. The protective layer 114 is provided with the contact hole CH to expose a portion of the drain electrode DE.

The pixel electrode 115 is disposed on the protective layer 114 and electrically connected to the drain electrode DE through the contact hole CH.

The seal pattern SP is disposed between the array substrate 110 and the opposite substrate 120 in the non-display area NDA. The seal pattern SP has conductivity. The seal pattern SP contacts the common voltage pad 117 to allow a common voltage to be applied to the common electrode 125 of the opposite substrate 120.

The source electrode SE is connected to the data line DL, and the data line DL is connected to the signal input pad SIP through the signal wire SL. The signal wire SL is disposed on the first base substrate 111 in the first non-display area NDA-1, and the signal input pad SIP is disposed on the lower surface of the first base substrate 111. The signal wire SL contacts the signal input pad SIP through the thru-hole TH.

FIGS. 18 to 21 are cross-sectional views for describing a method of manufacturing a display panel as shown in FIGS. 16 and 17.

The array substrate 110 is prepared. The array substrate 110 includes the display area DA and the non-display area NDA. The non-display area NDA includes the first non-display area NDA-1 adjacent to a side portion of the display area DA and the second non-display area NDA-2 other than the first non-display area NDA-1. The array substrate 110 includes the first base substrate 111, the thin film transistor TFT disposed on the first base substrate 111 in the display area DA, the pixel electrode 115 connected to the thin film transistor TFT, and the signal input pad SIP electrically connected to the thin film transistor TFT in the first non-display area NDA-1 and disposed on the lower surface of the first base substrate 111.

Figure 18:
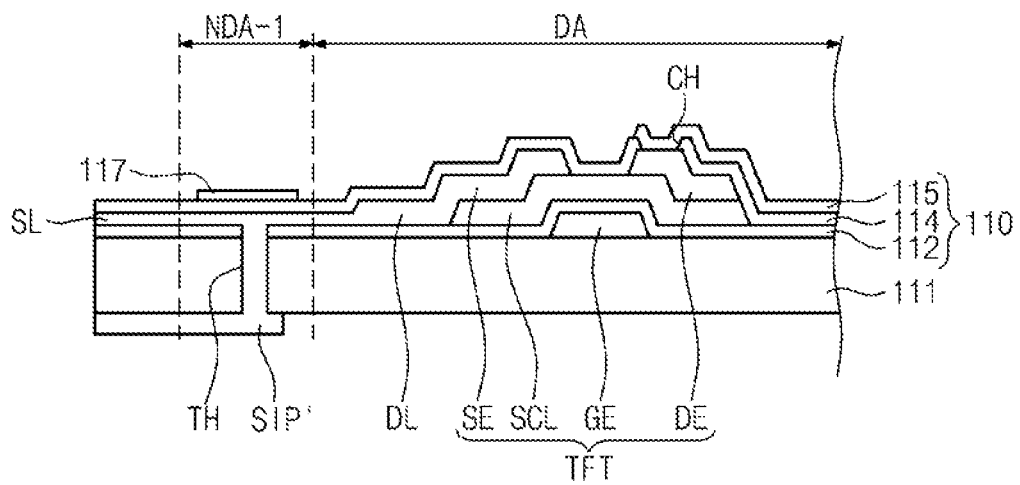
FIGS. 18 to 21 are cross-sectional view for describing a method of manufacturing a display panel as shown in FIGS. 16 and 17.

Referring to FIG. 18, the first base substrate 111 is prepared. The first base substrate 111 transmits light. The first base substrate has a rectangular plate shape with long sides and short sides.

A conductive material is deposited on the upper surface of the first base substrate 111 and is patterned to form the gate electrode GE and the gate line.

After forming the gate electrode GE and the gate line, the gate insulating layer 112 is formed to cover the gate electrode GE and the gate line.

Portions of the gate insulating layer 112 and the first base substrate 111 are removed in the first non-display area NDA-1 to form the thru-hole TH passing through the first base substrate 111 and the gate insulating layer 112.

When the thru-hole TH is formed, amorphous silicon is deposited on the gate insulating layer 112 and patterned to form the semiconductor layer SCL. Part of the semiconductor layer SCL overlaps the gate electrode GE.

A conductive material is deposited on the semiconductor layer SCL and the gate insulating layer 112 and patterned to form the source electrode SE, the drain electrode DE, the data line DL, and the signal wire SL. The source electrode SE and the drain electrode DE form the thin film transistor TFT together with the gate electrode GE and the semiconductor layer SCL. The source electrode SE and the drain electrode DE are spaced apart from each other and contact the semiconductor layer SCL. The source electrode SE is connected to the data line DL, and the data line DL is connected to the signal wire SL. The signal wire SL is filled in the thru-hole TH and exposed through the lower surface of the first base substrate 111.

A conductive material is deposited on the lower surface of the first base substrate 111 and patterned to form the signal input pad SIP in the first non-display area NDA-1. The signal input pad SIP contacts the signal wire SL.

The signal input pad SIP is separately formed, but it should not be limited thereto or thereby. Alternatively, no separate signal input pad SIP is provided. For example, according to an embodiment, when the signal wire SL is filled in the thru-hole TH and exposed through the lower surface of the first base substrate 111, the exposed portion of the signal wire SL may function as the signal input pad SIP.

The protective layer 114 is formed to cover the thin film transistor TFT. Part of the protective layer 114 is removed to form the contact hole CH through which a portion of the drain electrode DE is exposed.

The pixel electrode 115 is formed to be electrically connected to the drain electrode DE of the thin film transistor TFT through the contact hole CH, so that the array substrate 110 is formed.

Figure 19:
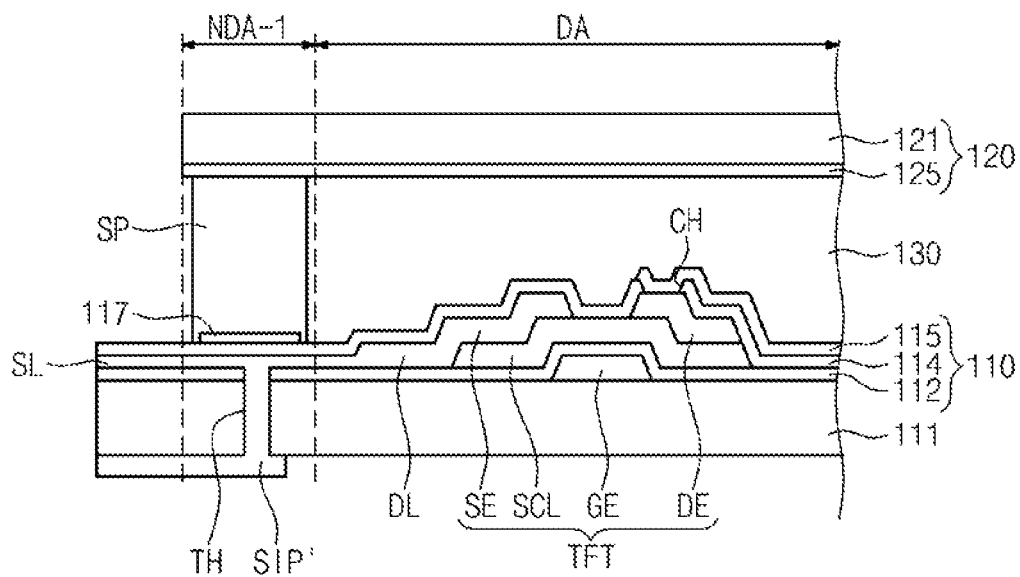

Referring to FIG. 19, after the array substrate 110 is formed, the seal pattern SP is formed in the non-display area NDA. The seal pattern SP has conductivity and is cured by heat or light.

After the seal pattern SP is formed, the liquid crystal layer 130 is disposed in the display area DA.

The opposite substrate 120 that includes the second base substrate 121 and the common electrode 125 disposed on the second base substrate 121 is prepared. The opposite substrate 120 is disposed such that the common electrode 125 faces the array substrate 110. The array substrate 110 and the opposite substrate 120 are coupled to each other by the seal pattern SP.

When heat or light is irradiated to the seal pattern SP after the array substrate 110 and the opposite substrate 120 are coupled to each other, the seal pattern SP is cured.

Figure 20:
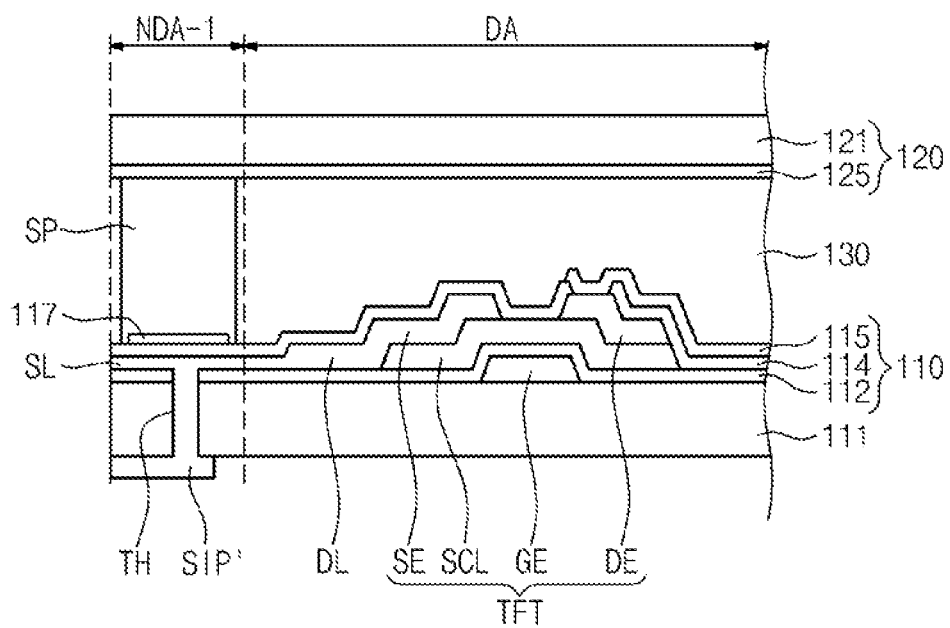

Referring to FIG. 20, after the seal pattern SP is cured, a portion of the array substrate 110, which protrudes beyond the opposite substrate 120 in the pad area PA, is removed.

Figure 21:
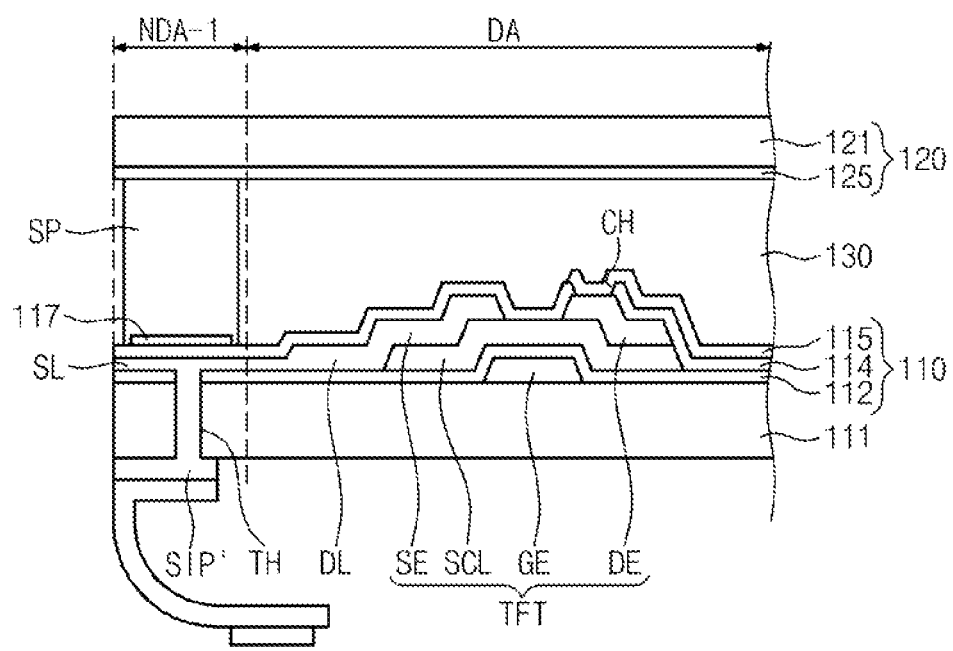

Referring to FIG. 21, after removing the portion of the first base substrate 110, the flexible printed circuit board 140 is attached to the signal input pad SIP, and thus the signal input pad SIP is electrically connected to the driver IC 141.

The flexible printed circuit board 140 is bent after the signal input pad SIP is connected to the flexible printed circuit board 140.

The display panel 100 and the backlight unit 200 are accommodated in the space between the upper cover and the lower cover, thereby forming the display apparatus.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A display panel comprising:
an array substrate including a display area and a non-display area surrounding the display area, wherein the non-display area includes a first non-display area adjacent to a side portion of the display area and a second non-display area;
an opposite substrate facing the array substrate; and
a liquid crystal layer between the array substrate and the opposite substrate, wherein the first non-display area comprises a wire area adjacent to the display area and a pad area and the pad area overlaps the opposite substrate, and
wherein the array substrate comprises:
a base substrate in the display area, the second non-display area, and the wire area;
a thin film transistor on the base substrate in the display area;
a pixel electrode connected to the thin film transistor;
a signal input pad in the pad area, wherein the signal input pad is electrically connected to a driver IC (Integrated Circuit), wherein the signal input pad includes an upper surface and a lower surface, and the lower surface is further apart from the opposite substrate in comparison with the upper surface; and
a signal wire in the wire area, wherein the signal wire connects the signal input pad with the thin film transistor, and
wherein the signal input pad is electrically connected to the driver IC through a flexible printed circuit board disposed under the array substrate and attached on the lower surface of the signal input pad.

2. The display panel of claim 1, wherein the array substrate further comprises an organic polymer pattern, wherein the organic polymer pattern supports the signal input pad and wherein the signal input pad is disposed on a lower surface of the organic polymer pattern.

3. The display panel of claim 2, further comprising a seal pattern between the array substrate and the opposite substrate in the non-display area.

4. The display panel of claim 3, wherein at least a portion of the seal pattern overlaps the organic polymer pattern in the first non-display area.

5. The display panel of claim 2, wherein the organic polymer pattern covers the pad area and extends to the wire area.

6. The display panel of claim 1, wherein the lower surface of the signal input pad is even with a lower surface of the base substrate.

7. A display panel comprising:
an array substrate including a display area and a non-display area surrounding the display area, wherein the non-display area includes a first non-display area adjacent to a side portion of the display area and a second non-display area;
an opposite substrate facing the array substrate; and
a liquid crystal layer between the array substrate and the opposite substrate, wherein the first non-display area comprises a wire area adjacent to the display area and a pad area and the first non-display area overlaps the opposite substrate, and
wherein the array substrate comprises:
a base substrate in the display area, the second non-display area, and the wire area;
a thin film transistor on the base substrate in the display area;
a pixel electrode connected to the thin film transistor;
a signal input pad in the pad area, wherein the signal input pad is electrically connected to a driver IC (Integrated Circuit); and
a signal wire in the wire area, wherein the signal wire connects the signal input pad with the thin film transistor, and wherein the signal input pad is electrically connected to the driver IC through a flexible printed circuit board attached on a lower surface of the signal input pad, wherein the lower surface of the signal input pad is even with a lower surface of the base substrate.

8. The display panel of claim 1, wherein the array substrate has the same area as the opposite substrate.

9. The display panel of claim 7, wherein the array substrate further comprises an organic polymer pattern, wherein the organic polymer pattern supports the signal input pad and wherein the signal input pad is disposed on a lower surface of the organic polymer pattern.

10. The display panel of claim 9, further comprising a seal pattern between the array substrate and the opposite substrate in the non-display area.

11. The display panel of claim 10, wherein at least a portion of the seal pattern overlaps the organic polymer pattern in the first non-display area.

12. The display panel of claim 9, wherein the organic polymer pattern covers the pad area and extends to the wire area.

13. The display panel of claim 7, wherein the array substrate has the same area as the opposite substrate.

* * * * *